(12) United States Patent
Sekiguchi et al.

(10) Patent No.: US 6,741,916 B1
(45) Date of Patent: May 25, 2004

(54) ACCIDENT POINT LOCATING SYSTEM

(75) Inventors: Katsuhiko Sekiguchi, Tama (JP);
Yoshihiro Shirota, Takasaki (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 659 days.

(21) Appl. No.: 09/709,493

(22) Filed: Nov. 13, 2000

(30) Foreign Application Priority Data

Nov. 11, 1999 (JP) .......................................... 11-321335

(51) Int. Cl.⁷ ...................... G05D 11/00; G05D 17/00; G05D 3/12; G05D 5/00; G05D 9/00
(52) U.S. Cl. ...................... 700/292; 700/293; 700/297; 700/21; 700/22; 700/306; 700/20; 702/59; 702/187
(58) Field of Search .................... 700/20–22, 286, 700/292, 293, 296, 297, 306; 702/59, 187; 324/512; 340/310.01, 538, 3.43; 455/67.1; 379/14.01, 15.05, 22.03

(56) References Cited

U.S. PATENT DOCUMENTS

| | | | | |
|---|---|---|---|---|
| 4,972,290 A | * | 11/1990 | Sun et al. | 361/64 |
| 5,070,537 A | * | 12/1991 | Ohira et al. | 455/67.3 |
| 5,508,619 A | * | 4/1996 | Ozawa et al. | 324/535 |
| 5,729,144 A | * | 3/1998 | Cummins | 324/535 |
| 6,018,451 A | * | 1/2000 | Lyke et al. | 361/93.2 |
| 6,259,255 B1 | * | 7/2001 | Ohira et al. | 324/535 |
| 6,313,752 B1 | * | 11/2001 | Corrigan et al. | 340/657 |
| 6,546,360 B1 | * | 4/2003 | Gilbert et al. | 702/188 |

FOREIGN PATENT DOCUMENTS

| | | | | |
|---|---|---|---|---|
| JP | 63206668 A | * | 8/1988 | ........... G01R/31/08 |
| JP | 08-233895 | | 9/1996 | ........... G01R/31/08 |

* cited by examiner

Primary Examiner—Emanuel Todd Voeltz
Assistant Examiner—Crystal J Barnes
(74) Attorney, Agent, or Firm—Finnegan, Henderson, Farabow, Garrett & Dunner, L.L.P.

(57) ABSTRACT

An accident point locating system locates an accident point on a power transmission line. A digital protective control system has a plurality of digital protective controllers that receive state data representing a state of an electric power system and convert the same into corresponding digital state data. An absolute time acquiring means acquires an absolute time when the state data is sampled. A state data processing decides whether any malfunction occurred in the power transmission system on the basis of the digital state and executes a protective operation when it is decided that an accident occurred in the power transmission system. A recording device adds an absolute sampling time to the digital state data and records the digital state data with the absolute time. A digital data sending device provides the digital state data with the absolute time on a communication network. A display operating system connected to the communication network executes displaying operations to monitor the operation and condition of the digital protective controllers. The display operating system has a distance calculating device for calculating a distance between a control station and an accident point by using the plurality of digital state data with the absolute time received from the digital protective controllers and a display for displaying the output of the distance calculating device.

4 Claims, 9 Drawing Sheets

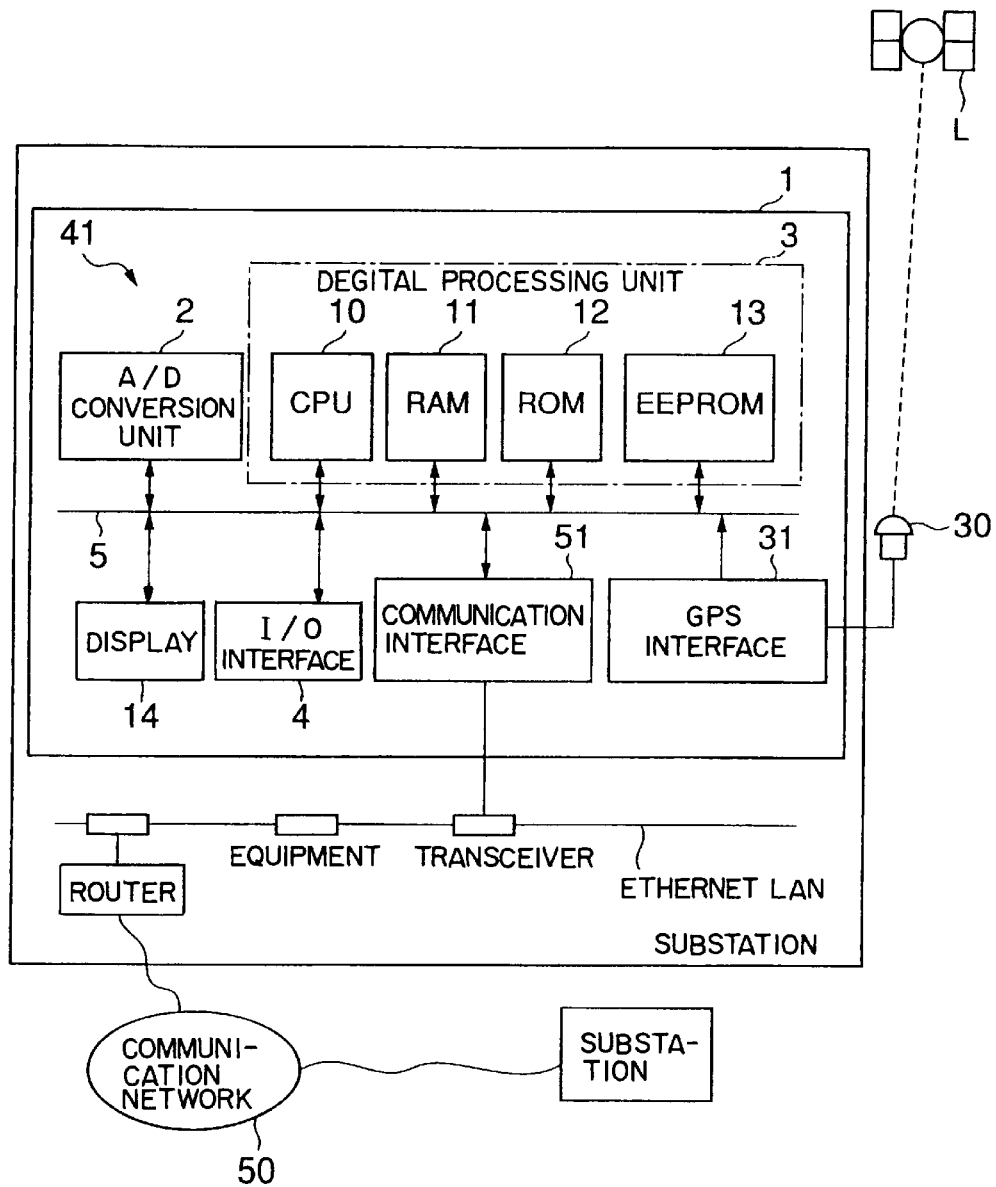
F I G. 3

ACCIDENT POINT LOCATING SYSTEM

BACKGROUND OF THE INVENTION

1. Field of the Invention

The present invention relates to an accident point locating system comprising, in combination, a digital protective control system that receives state quantities indicating a state of an electric power system, converts the state quantities into corresponding data and carries out the protective control of the electric power system, and a display system that carries out displaying and controlling operations to monitor the operation and state of the digital protective control system through a communication network.

2. Description of the Related Art

Digital protective control systems are used prevalently in the field of electric power systems. The functions of digital protective control systems have been advanced in recent years by the employment of high-performance microprocessors and large-capacity memories. More concretely, digital protective control systems include protective relay systems that detect accidents in electric power systems, accident point locating systems that locate accident point in electric power systems, and system stabilizing systems that stabilizes electric power systems. The digital protective control systems are applied prevalently to the operation of electric power systems.

A conventional digital protective control system will be described. Referring to FIG. 9, a digital protective control system 1 includes an A/D conversion unit 2, a digital processing unit 3, an I/O interface 4 connected to an external device, such as a circuit breaker, and a bus 5. Those components are interconnected by the bus 5.

The A/D conversion unit 2 includes analog filters 6-1 to 6-n, sample-and-hold circuits 7-1 to 7-n, a multiplxer 8 and an A/D converter 9. The A/D conversion unit 2 receives n pieces of analog information A-1 to A-n representing state data on the state of an electric power system to be protected and controlled, such as current and voltage, samples the n pieces of analog information A-1 to A-n at predetermined sampling intervals, holds sampled analog state data and converts the analog state data into corresponding digital state data.

The digital processing unit 3 includes a CPU 10, a RAM 11, a ROM 12, and an EEPROM (electrically erasable programmable read-only memory) 13. The digital state data is transferred sequentially to the RAM 11. The CPU 10 carries out various protective operations including a relay operation by using the digital state data stored in the RAM 11 and set values for a protection relay stored in the EEPROM 13 according to programs stored in the ROM 12.

The I/O interface 4 receives information about external controllers including information about a circuit breaker and gives output signals including a signal requesting the operation of the protection relay, a reset signal and a trip command to external devices. The display 14 is a human interface that displays the state and operating condition of the digital protective control system.

An accident point locating system uses an accident point locating algorithm for calculating the distance between a control station and an accident point by using data provided by the A/D conversion unit in the ROM 10 and gives data on the distance between the control station and the accident point to the display 14. Practically used accident point locating algorithms include those of an impedance calculating system that use only data available from the own control station, and those of a positive-phase loop locating system that uses electrical quantity data available from the own control station and those available through special transmission lines from other control stations. A concrete algorithm transmission line system for locating operations is described in, for example, Japanese Pat. Application No. Hei 7-64729 (JP-A No. Hei 8-233895) made by the applicant of the present patent application.

The social importance of the electric power system has increased in recent years. The electric power system requires considerable labor for maintenance and operation. For instance, when an accident occurs in a power transmission line, an accident point where the accident occurred must be located and the condition of equipment relating to the accident point must be quickly confirmed. An accident point locating system is used for calculating the distance between the relevant control station and the accident point on the basis of electric quantity data at the moment the accident occurred to reduce labor for maintenance and operation. However, the conventional accident point locating system composed of hardware equivalent to a digital protective control system is expensive. Since the display for displaying the results of accident point locating operations is able to display limited information, such as the distance between the control station and the accident point and a phase in which the accident occurred. Consequently, the output of the accident point locating system must be checked against a power transmission system map showing the layout of power transmission lines to locate the accident point.

SUMMARY OF THE INVENTION

Accordingly, it is a first object of the present invention to reduce special hardware and to reduce the cost by carrying out accident point locating operations by an display operating apparatus, such as a personal computer. A second object of the present invention is to provide a highly reliable accident point locating system capable of automatically indicating an accident point on a map by checking the results of accident point locating operations against geographic map information and power transmission line map information, of reducing load on operation and maintenance personnel and of being easily operated.

To achieve the object, according to a first aspect of the present invention, an accident point locating system is provided, which includes: a plurality of digital protective controllers that receive state data representing a state of an electric power system, convert the state data into corresponding digital state data and execute an electric power system protecting control, each of the digital protective controllers having an absolute time acquiring means for acquiring an absolute time, an A/D converting means for sampling the state data at a predetermined sampling period at absolute times acquired by the absolute time acquiring means and converting the sampled state data into corresponding digital state data, a state data processing means for deciding whether any malfunction occurred in equipment to be protected on the basis of the digital state data provided by the A/D converting means, a state decision means for executing a malfunction decision function other than the malfunction decision function of the state data processing means on the basis of the digital state data provided by the A/D converting means to decide whether or not any malfunction occurred in the equipment to be protected and in the vicinity of the equipment, a recording means for adding absolute sampling time to the digital state data provided by the A/D converting means and recording the digital state data with the absolute time when the state decision means decides that a malfunction occurred in the equipment to be controlled and protected or in the vicinity of the equipment, and a digital data sending means for reading the digital state data with the absolute time from the recording means and providing the same on a communication network; and a display operating system that is connected to the plurality of digital protective controllers by the communication network and executes displaying operations to monitor the operation and condition of the digital protective controllers, the display operating system having a digital state data receiving means connected to the communication network to receive a plurality of digital state data with the absolute time through the communication network, distance calculating means for calculating the distance between the control station and an accident point by using the plurality of digital state data with the absolute time received by the digital data receiving means, and a display means for displaying the output of the distance calculating means.

According to the present invention, the display operating system receives the digital state data with the absolute time provided on the communication network by the digital protective control system and executes operations for accident point location. The operations for accident point location can be carried out by the display operating system comprising a personal computer or the like, special hardware can be reduced and the cost can be reduced.

Preferably, the accident point locating system further comprises a recording unit connected to the communication network and comprising a receiving means for receiving the digital state data with the absolute time provided by the digital protective controllers, a storage means for storing the received digital state data, a program module storage means for storing an accident point locating program module specifying accident point locating operations, and a sending means for sending out the digital state data with the absolute time stored in the storing means and the accident point locating program module stored in the program module storage means; wherein the display operating system further comprises a requesting means for requesting the recording unit to give the same the digital state data with the absolute time and the accident point locating program module, the receiving means of the display operating system is capable of receiving the digital state data with the absolute time and the accident point locating program module requested by the requesting means, and the distance calculating means of the display operating system is capable of executing the accident point locating program module on the basis of the digital state data with the absolute time received by the receiving means of the display operating system.

The digital state data with the absolute time of occurrence of the accident and the accident point locating program module are stored in the storage means of the accident point locating system, the digital state data with the absolute time and the accident point locating program module are downloaded into the display operating system, such as a personal computer, the accident point locating program module is executed by the display operating system, and the unitary management of the digital state data with the absolute time and the accident point locating program module can be easily achieved.

Preferably, the display operating system further includes a power transmission line map data storage means for storing power transmission line map data, and checking means for checking the output of the accident point locating means representing the distance between a control station and an accident point against the power transmission line map data, and the display means has a function to display the accident point on the power transmission line map data on the basis of the result of checking by the checking means.

The accident point locating system thus constructed is capable of checking the result of the accident point locating operations against the power transmission line map data and of indicating the accident point on the map with reliability. Preferably, the display operating system includes a phenomenon discriminating means that decides that a plurality of digital state data with the absolute time received from the plurality of digital protective controllers in a predetermined time period are those on a single phenomenon on the basis of a time-dependent causal relationship between the digital state data provided by the plurality of digital protective controllers.

Since the digital state data with the absolute time are handled as a single data on the basis of the time-dependent causal relationship between the digital state data provided by the plurality of protective controllers, data to be used for accident point locating operation can be automatically determined.

BRIEF DESCRIPTION OF THE DRAWINGS

The above and other objects, features and advantages of the present invention will become more apparent from the following description taken in connection with the accompanying drawings, in which:

FIG. 3 is a block diagram of the digital protective controller shown in FIG. 1;

DESCRIPTION OF THE PREFERRED EMBODIMENTS

First Embodiment

A digital accident point locating system in a first embodiment according to the present invention will be described with reference to FIGS. 1 to 3.

Figure 1:
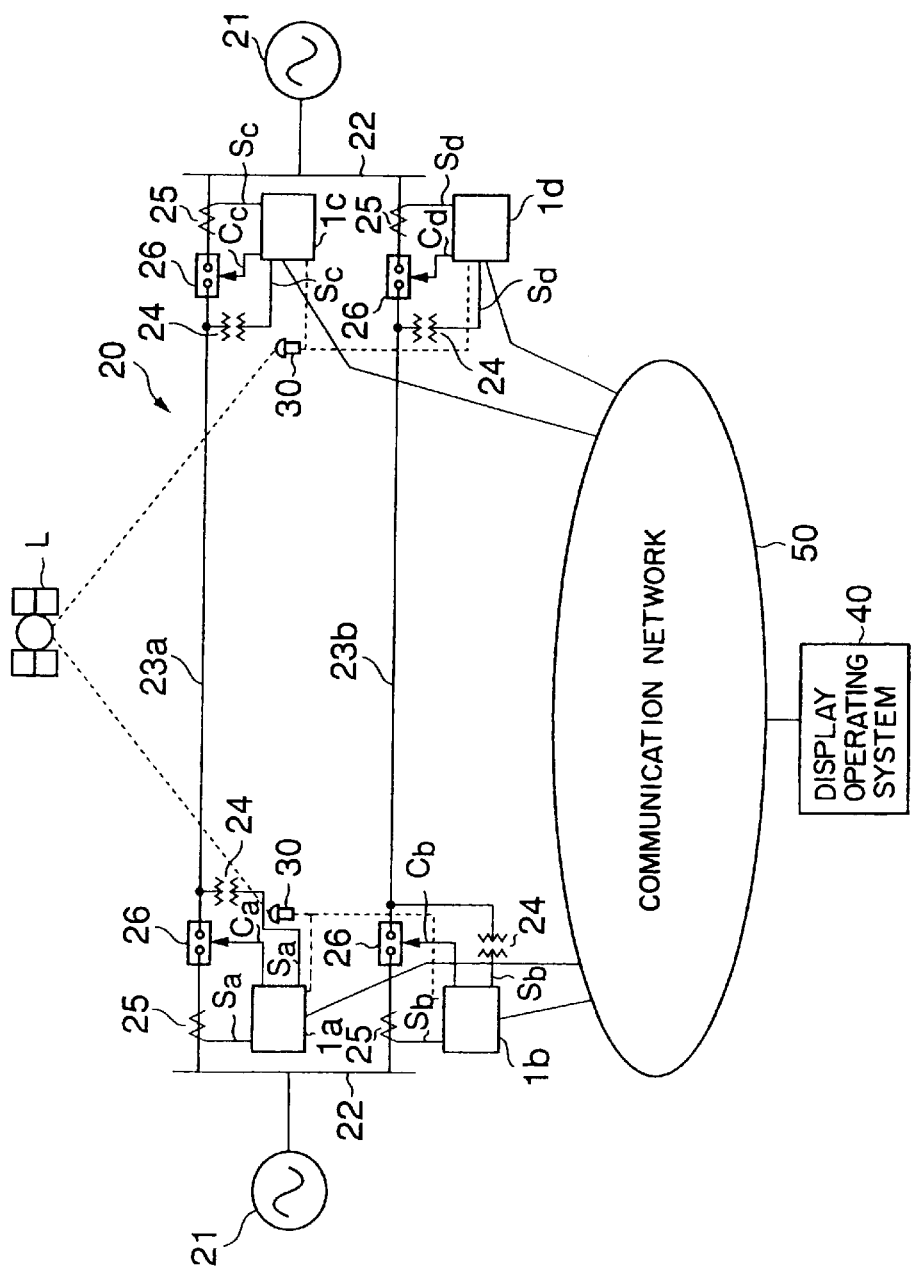
FIG. 1 is diagrammatic view of an electric power system protecting and controlling system provided with an accident point locating system in a first embodiment according to the present invention.
Figure 2:
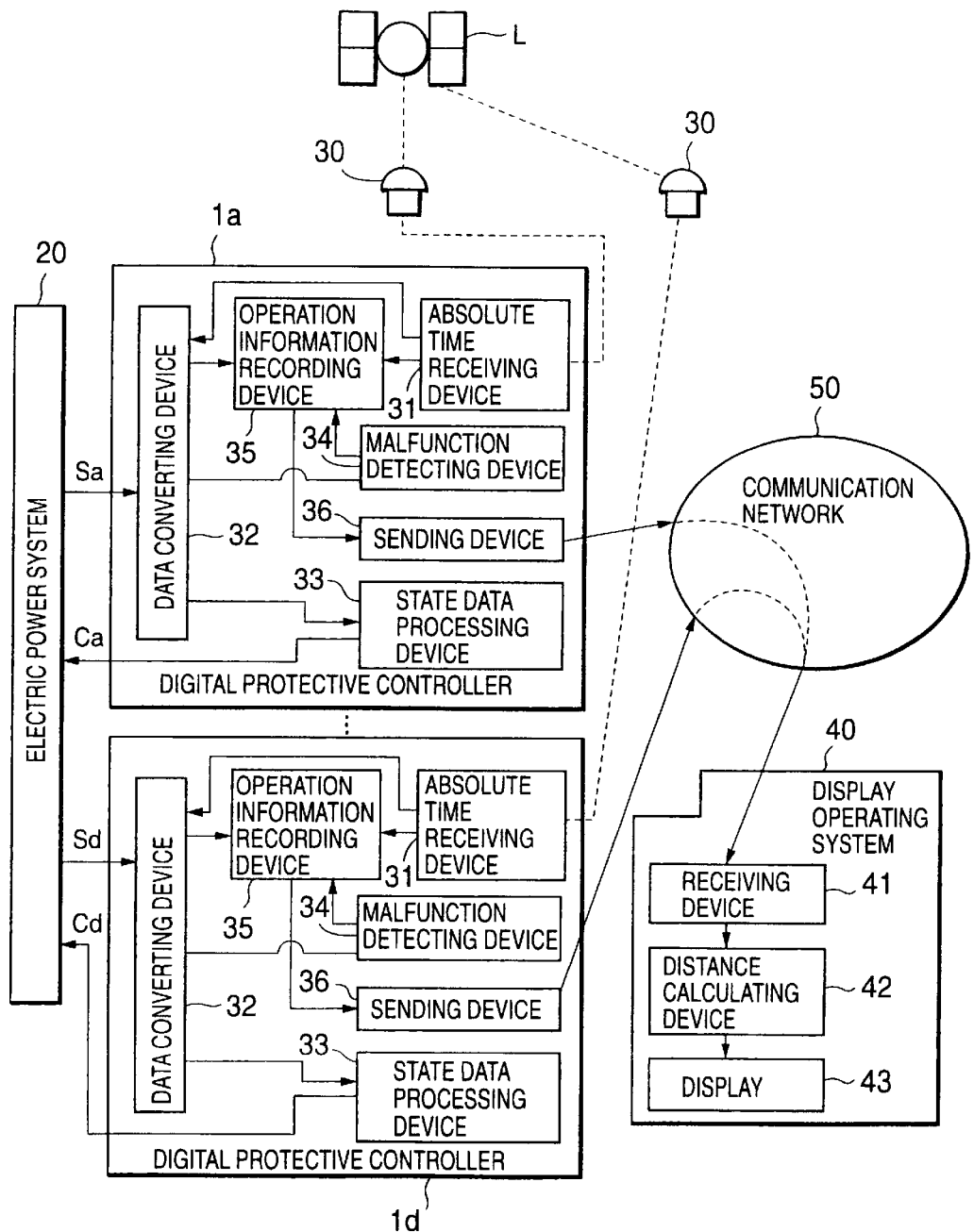
FIG. 2 is a block diagram of digital protective controllers and a display operating system shown in FIG. 1.

Referring to FIG. 1, an electric power system 20 to be protected and controlled by an electric power system protecting and controlling system includes ac generators 21, buses 22 connected to the ac generators 21, and power transmission lines 23a and 23b extending from the buses 22. Each of digital protective controllers 1a to 1d is connected to a potential transformer 24 and a current transformer 25. The digital protective controllers 1a to 1d receive state data Sa to Sd on the state of the power transmission lines 23a and 23b of the electric power system 20 through the voltage transformers 24 and the current transformers 25, and convert the state data into electric data. The digital protective controllers 1a to 1d provide control signals Ca to Cd for operating switches 26 that connect the power transmission lines 23a and 23b to and disconnect the same from the buses 22 to protect and control the electric power system 20.

The digital protective controllers 1a to 1d are connected to a communication network 50 connected to a display operating system 40.

The digital protective controllers 1a to 1d and the display operating system 40 will be described with reference to FIG. 2. The digital protective controllers 1a to 1d have the same configuration and hence only the digital protective controllers 1a and 1d are shown in FIG. 2 (also in FIGS. 5, 6 and 7) for simplicity of the drawing, and only the digital protective controller 1a will be described. The digital protective controller 1a employs a GPS (Global Positioning System) as means for acquiring absolute time. The digital protective controller 1a is provided with an absolute time receiving device (absolute time acquiring means) 31 that receives a time signal emitted by an artificial satellite L provided with a built-in atomic clock through an antenna 30 and decodes the time signal to recognize an accurate absolute time in an accuracy on the order of 100 ns.

A data converting device 32 samples the state data Sa on the state of the electric power system 20 at a predetermined period at absolute times and converts the sampled state data Sa into corresponding digital data. Since the protective controllers 1a to 1d use the absolute time as a common reference time, data converting operations of the data converting devices 32 of the protective controllers 1a to 1d can be synchronized.

A state data processing device 33 processes digital data received from the data converting device 32 and decides whether any malfunction occurred in the equipment of the electric power system 20. When it is decided that an accident occurred in the equipment of the electric power system 20, the state data processing device 33 gives the control signal Ca to the switch 26.

A malfunction detecting device (state decision means) 34 detects a malfunction occurred in the equipment of the electric power system 20 or in the vicinity of the equipment from the digital state data received from the data converting device 32. The malfunction detecting device 34 may be an undervoltage relay, an overvoltage relay or an overcurrent relay.

An operation information recording device (recording means) 35 adds an absolute time at which data is sampled to the digital state data provided by the data converting device 32 when a malfunction detection signal is provided by the malfunction detecting device 34 upon the detection of a malfunction, and stores the digital state data with the absolute time. The state data with the absolute time is sent to a communication network 50 by a data sending device 36.

The display operating system 40 connected to the communication network 50 has a receiving device 41 that receives the digital state data with the absolute time sent out on the communication network 50 by the digital protective controllers 1a to 1d. A distance calculating device 42 calculates the distance between the control station and the accident point on the basis of the digital state data with the absolute time to locate the accident point. The configuration of the distance calculating device 42 is not the gist of the present invention and hence the description thereof will be omitted. The distance calculating device 42 may be such as disclosed in Japanese Pat. Application No. Hei 7-64729 (JP-A No. Hei 8-233895) made by the applicant of the present patent application.

Figure 9:
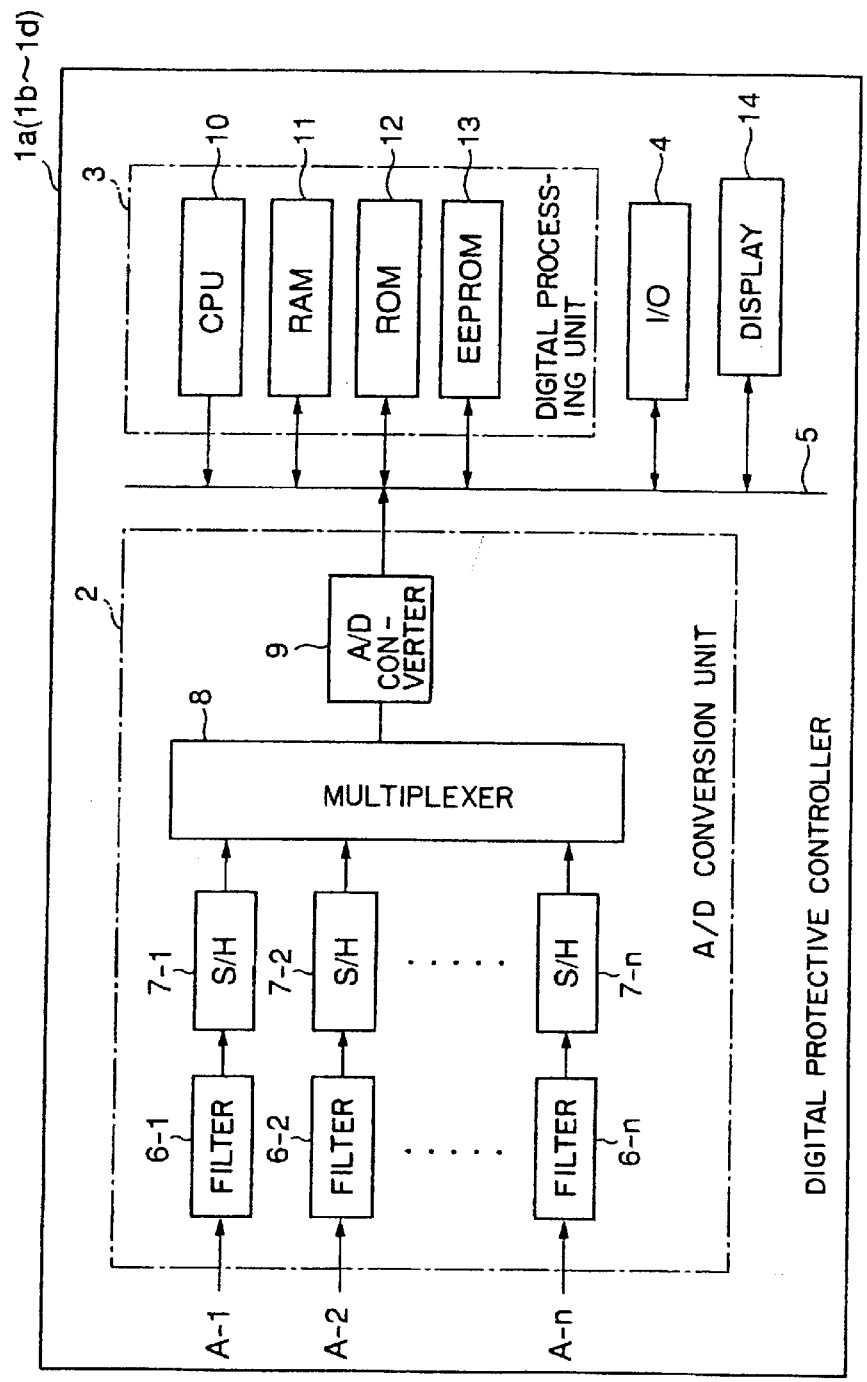
FIG. 9 is block diagram of a prior art digital protective control system.

FIG. 3 shows the configuration of the digital protective controller 1a (1b, 1c and 1d) included in the accident point locating system in the first embodiment, in which parts like or corresponding to those shown in FIG. 9 are denoted by the same reference characters. Referring to FIG. 3, the digital protective controller 1a includes, in addition to components corresponding to the prior art digital protective controller, the absolute time receiving device (GPS interface) 31 and a communication interface 51 connected to the communication network 50. The digital protective controller 1a is connected to LAN devices, such as a transceiver and a router. The equipment of the LAN is the same as that of a general Ethernet LAN and hence the description thereof will be omitted.

The digital accident point locating system in the first embodiment uses the digital protective controller for acquiring data and uses general-purpose hardware, such as a personal computer, for calculation instead of hardware equivalent to a digital protective controller. Thus, the digital accident point locating system can be formed at a low cost.

Second Embodiment

A digital accident point locating system in a second embodiment according to the present invention will be described with reference to FIGS. 4 and 5. The second embodiment differs from the first embodiment in additionally including a recording system 60 and employing a display operating system 40 partly different from that employed in the first embodiment. The second embodiment is substantially the same as the first embodiment in other respects and hence components of the second embodiment corresponding to those of the first embodiment are denoted by the same reference characters and the description thereof will be omitted to avoid duplication.

Figure 4:
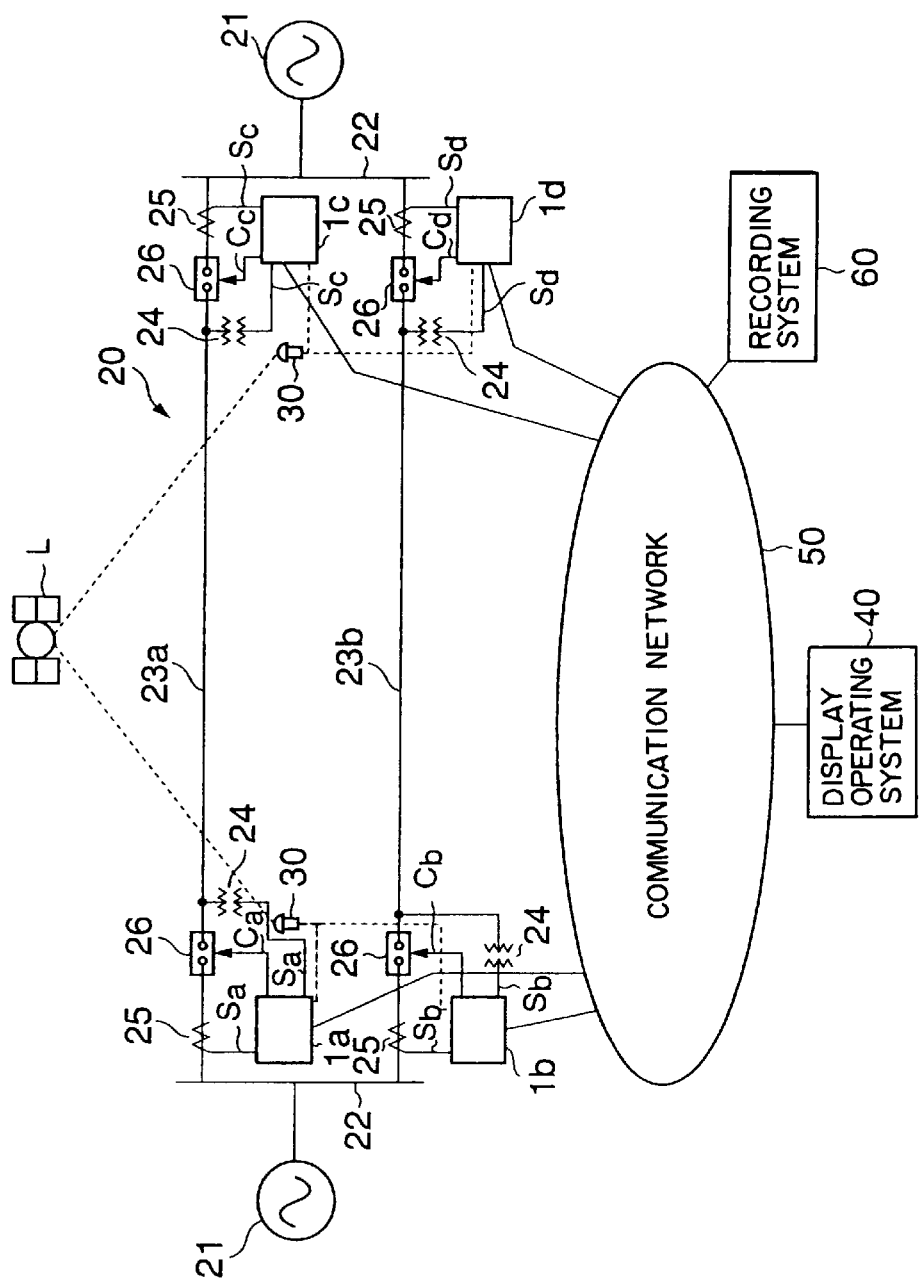
FIG. 4 is a diagrammatic view of an electric power system protecting system provided with an accident point locating system in a second embodiment according to the present invention.
Figure 5:
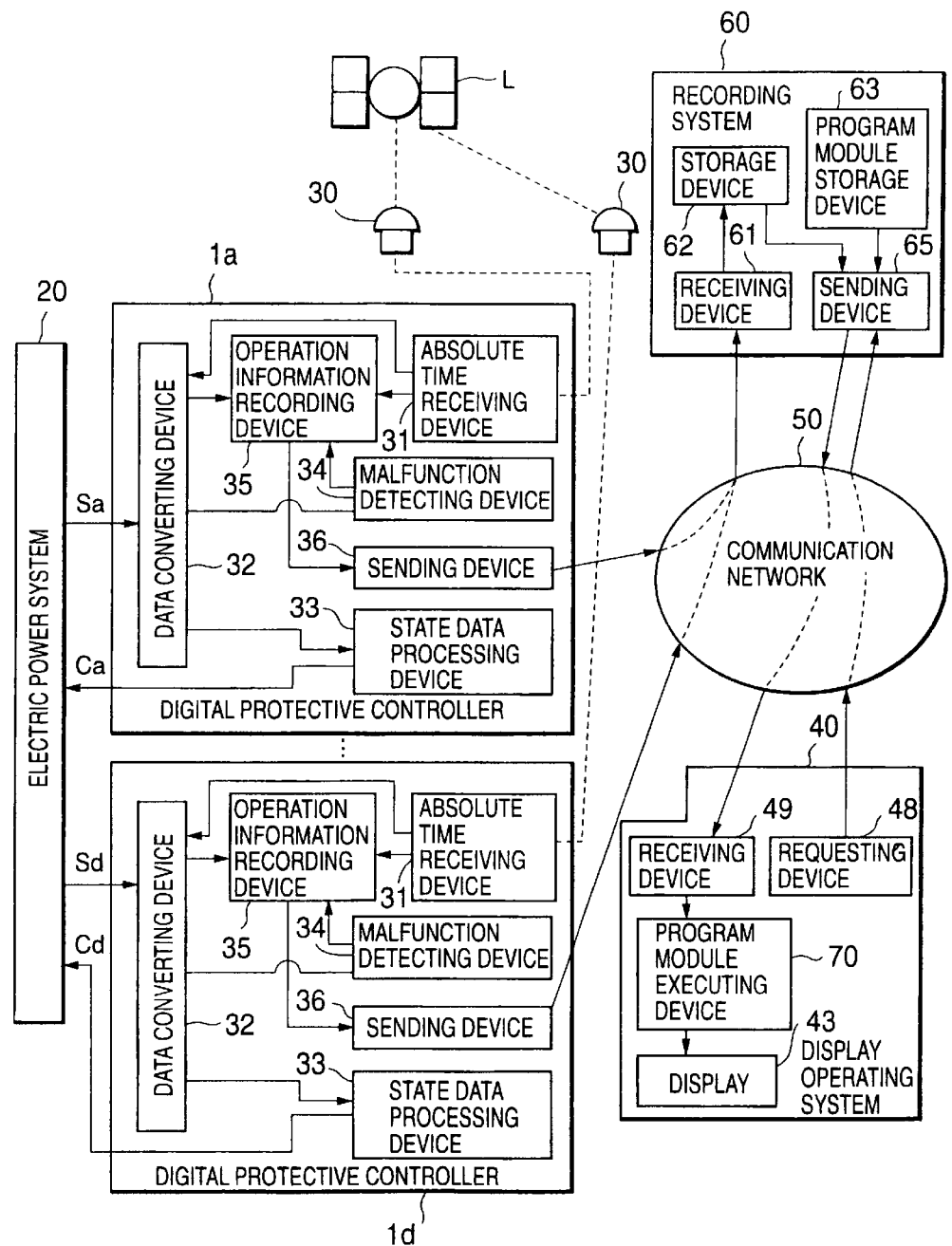
FIG. 5 is a block diagram of a digital protective control system and a display operating system shown in FIG. 4.

Referring to FIG. 4, the digital accident point locating system in the second embodiment includes the recording system 60. The respective configurations of the digital protective controllers 1a and 1d, the display operating system 40 and the recording system 60 are shown in FIG. 5. The configurations of the digital protective controllers 1a and 1d shown in FIG. 5 are the same as those shown in FIG. 2. Digital state data with the absolute time obtained upon the occurrence of an accident is sent to the communication network 50 by the data sending device 36. The recording system 60 connected to the communication network 50 receives the digital state data with the absolute time given to the communication network 50 by the plurality of digital protective controllers 1a and 1d by a receiving device 61 and stores the same in a storage device 62. An accident point locating program module is stored beforehand in a program module storage device 63.

Upon the reception of a signal sending request signal from a requesting device 48 included in the display operating system 40, a sending device 65 sends out the digital state data with the absolute time stored in the storage device 62 and the accident point locating program module stored in the program module storage device 63 onto the communication network 50.

The display operating system 40 receives the digital state data with the absolute time and the accident point locating program module sent out by the sending device 65 included in the recording system 60 by a receiving device 49. A program module executing device 70 executes the accident point locating program module to locate an accident point and a display 43 displays the accident point. In the second embodiment, the program module executing device 70 functions as the distance calculating means.

The second embodiment exercises the same effect as the first embodiment and the unitary management of the digital state data with the absolute time and the accident point locating program module can be easily achieved.

Third Embodiment

An accident point locating system in a third embodiment according to the present invention will be described with reference to FIG. 6. The third embodiment differs from the first embodiment in employing a display operating system 40 different from that of the first embodiment. The third embodiment is substantially the same in system construction and the configuration of a digital protective control system thereof as the first embodiment shown in FIGS. 1 and 3. Reference will be made to only FIG. 6 showing digital protective controllers and a display operating system, in which components of the third embodiment corresponding to those of the first embodiment shown in FIG. 2 are denoted by the same reference characters and the description thereof will be omitted to avoid duplication.

Figure 6:
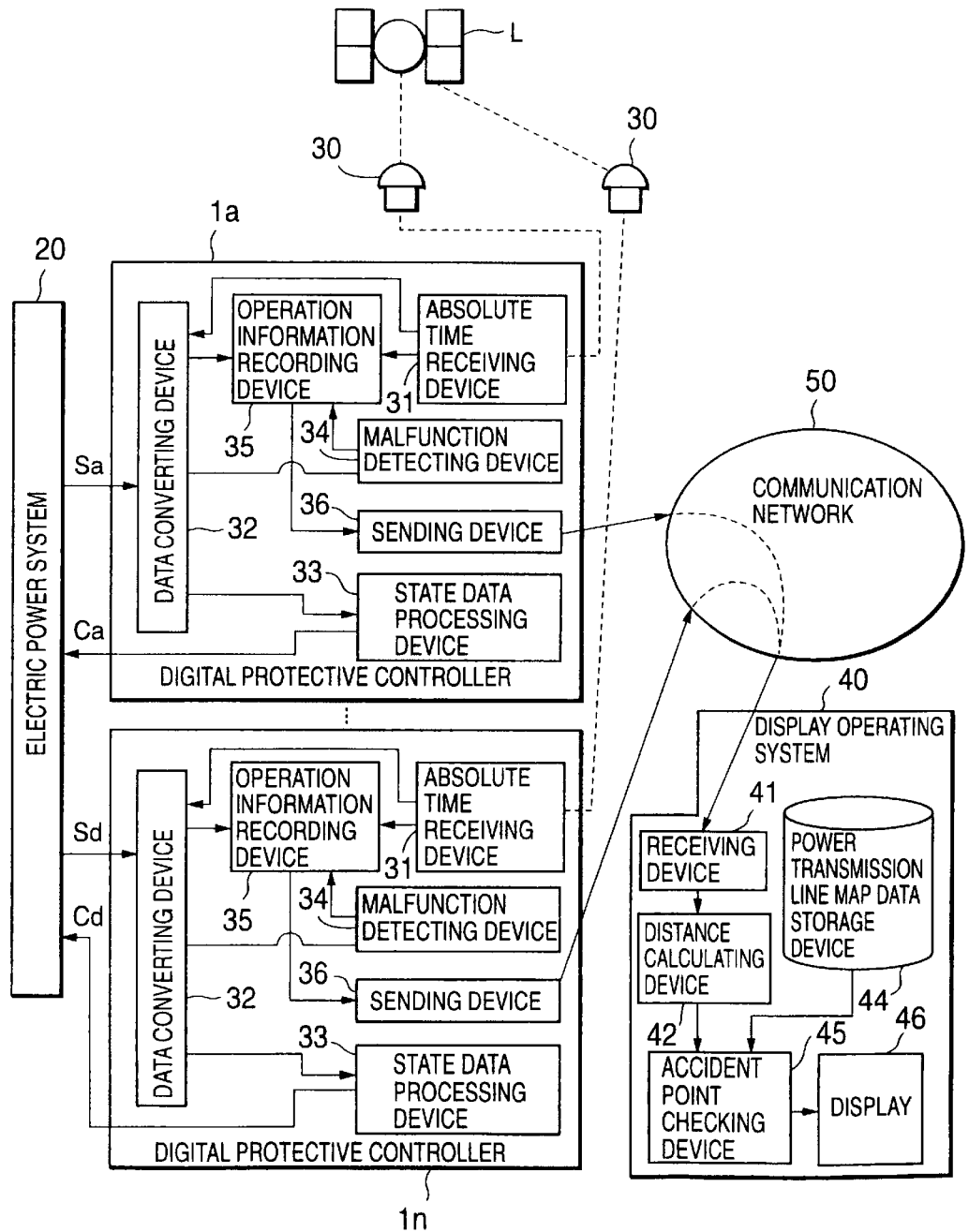
FIG. 6 is a block diagram of a digital protective control system and a display operating system included in an accident point locating system in a third embodiment according to the present invention.

Referring to FIG. 6, the display operating system 40 of an accident point locating system in the third embodiment comprises, in addition to components corresponding to those of the display operating system 40 of the accident point locating system in the first embodiment, a power transmission line map data storage device 44 and an accident point checking device 45.

The accident point checking device 45 locates an accident point on the basis of the distance between a control station and the accident point calculated by the distance calculating device 42 and power transmission line map data stored in the power transmission line map data storage device 44. The display 46 indicates the accident point on a power transmission line map.

Sections of the power transmission line between steel towers can be assumed to be straight and the distances between steel towers are known. The power transmission line map data stored in the power transmission line map data storage device 44 includes steel tower position data. The distance between, for example, a digital protective controller 1a and the accident point calculated by the distance calculating device 42 is checked against the power transmission line map data to find a section between steel towers in which an accident has occurred, and the section is indicated on a power transmission map.

The accident point locating system in the third embodiment indicates the accident point on the power transmission line map to enable the visual recognition of the accident point.

Fourth Embodiment

An accident point locating system in a fourth embodiment according to the present invention will be described with reference to FIGS. 7 and 8. The fourth embodiment differs from the first embodiment in employing a display operating system 40 different from that of the first embodiment. The fourth embodiment is substantially the same in system construction and the configuration of a digital protective control system thereof as the first embodiment shown in FIGS. 1 and 3. Reference will be made to only FIG. 7 showing digital protective controllers and a display operating system, in which components of the fourth embodiment corresponding to those of the first embodiment shown in FIG. 2 are denoted by the same reference characters and the description thereof will be omitted to avoid duplication.

Figure 7:
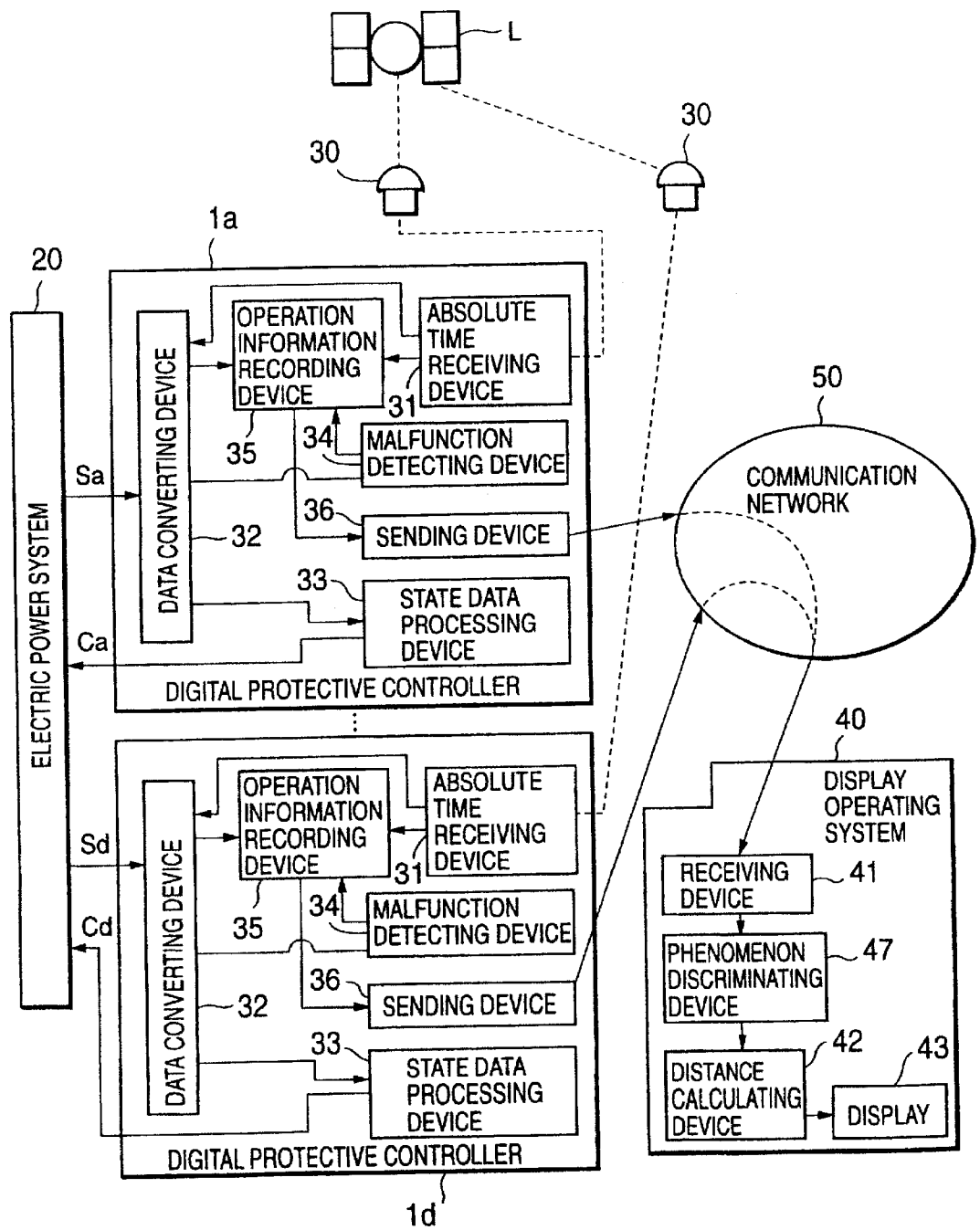
FIG. 7 is a block diagram of a digital protective control system and a display operating system included in an accident point locating system in a fourth embodiment according to the present invention.

Referring to FIG. 7, the display operating system 40 of the accident point locating system in the fourth embodiment comprises, in addition to components corresponding to those of the display operating system 40 of the accident point locating system in the first embodiment, a phenomenon discriminating device 47. The phenomenon discriminating device 47 decides that digital state data with the absolute time received by the receiving device 41 in a predetermined time period are those on a single phenomenon. A plurality or digital state data decided to be accident data on a single phenomenon by the phenomenon discriminating device 47 are processed collectively by the distance calculating device 42.

Figure 8:
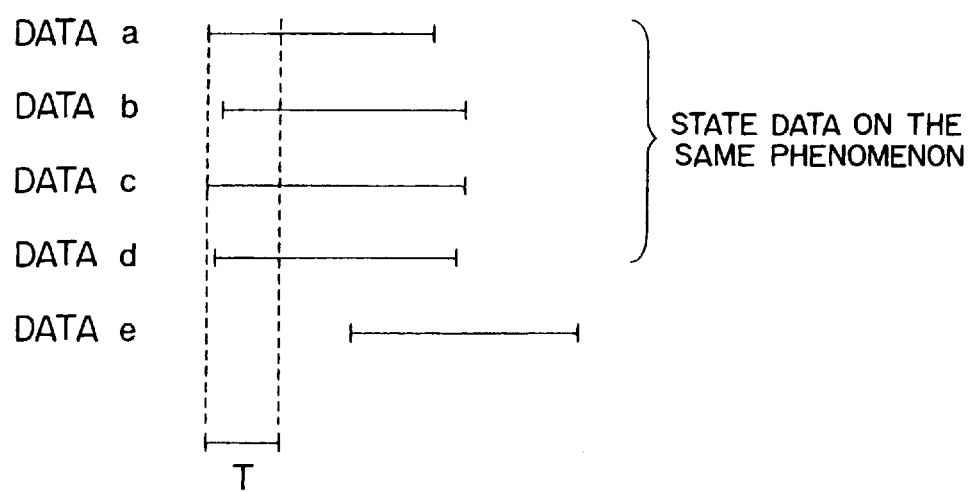
FIG. 8 is a time chart of assistance in explaining the operation of a phenomenon discriminating device shown in FIG. 7.

FIG. 8 is a time chart of assistance in explaining the operation of the phenomenon discriminating device 47. The phenomenon discriminating device 47 compares absolute times recorded at the heads of a plurality of data a, b, c, d and e.

The phenomenon discriminating device 47 decides that the data having the absolute times in a predetermined time period T are those on the same phenomenon. In FIG. 8, the absolute times of the data a, b, c and d are in the predetermined time period T and hence the data a, b, c and d are considered to be those on the same phenomenon, and the data e having the absolute time not lying in the predetermined time period T is considered to be that on another phenomenon. When a plurality of accidents occur and a plurality of digital state data with the absolute time are provided, the digital data on the same accident are selected automatically and are used for accident point locating operations.

As apparent from the foregoing description, according to the present invention, the distance calculating operation is carried out by the display operating system including a personal computer. Therefore, special hardware can be omitted and the accident point locating system can be constructed at a low cost.

Since the distance between the control station and the accident point is checked against the power transmission lime map data, and the accident point is indicated automatically on the power transmission line map, load on the operator is reduced and the accident point locating system is highly reliable and easy to operate.

Although the invention has been described in its preferred embodiments with a certain degree of particularity, obviously many changes and variations are possible therein. It is therefore to be understood that the present invention may be practiced otherwise than as specifically described herein without departing from the scope and spirit thereof.

What is claimed is:

1. An accident point locating system comprising:
   a plurality of digital protective controllers that receive state data representing a state of an electric power system, convert the state data into corresponding digital state data and execute an electric power system protecting control, each of said digital protective controllers including:
      an absolute time acquiring means for acquiring an absolute time,
      an A/D converting means for sampling the state data at a predetermined sampling period at absolute times acquired by the absolute time acquiring means and converting the sampled state data into corresponding digital state data,
      a state data processing means for deciding whether any malfunction occurred in equipment to be protected on the basis of the digital state data provided by the A/D converting means and executing a protective operation when it is decided that a malfunction occurred in the equipment, a state decision means for executing a malfunction decision function other than the malfunction decision function of the state data processing means on the basis of the digital state data provided by the A/D converting means to decide whether or not any malfunction occurred in the equipment to be protected and in the vicinity of the equipment, a recording means for adding absolute sampling time to the digital state data provided by the A/D converting means and recording the digital state data with the absolute time when the state decision means decides that a malfunction occurred in the equipment to be controlled and protected or in the vicinity of the equipment, and a digital data sending means for reading the digital state data with the absolute time from the recording means and providing the same on a communication network; and a display operating system that is connected to the plurality of digital protective controllers by the communication network and executes displaying operations to monitor the operation and condition of the digital protective controllers, said display operating system including:

a digital state data receiving means connected to the communication network to receive a plurality of digital state data with the absolute time through the communication network, distance calculating means for calculating a distance between a control station and an accident point by using the plurality of digital state data with the absolute time received by the digital data receiving means, and a display means for displaying the output of the distance calculating means.

2. The accident point locating system according to claim 1 further comprising a recording unit, the recording unit including:

a receiving means connected to the communication network to receive the digital state data with the absolute time provided by the digital protective controllers, a storage means for storing the received digital state data, a program module storage means for storing an accident point locating program module specifying accident point locating operations, and a sending means for sending out the digital state data with the absolute time stored in the storing means and the accident point locating program module stored in the program module storage means;

wherein the display operating system further comprises a requesting means for requesting the recording unit to give the same the digital state data with the absolute time and the accident point locating program module, the receiving means of the display operating system is capable of receiving the digital state data with the absolute time and the accident point locating program module requested by the requesting means, and the distance calculating means of the display operating system is capable of executing the accident point locating program module on the basis of the digital state data with the absolute time received by the receiving means of the display operating system.

3. The accident point locating system according to claim 1 or 2, wherein the display operating system further includes:

a power transmission line map data storage means for storing power transmission line map data, and checking means for checking output of the distance calculating means indicating a distance between the control station and an accident point against the power transmission line map data, and the display means of the display operating system has a function to display the accident point on the power transmission line map data on the basis of the result of checking by the checking means.

4. The accident point locating system according to claim 1 or 2, wherein the display operating system further includes a phenomenon discriminating means that decides that a plurality of digital state data with the absolute time received from the plurality of digital protective controllers in a predetermined time period are those on a single phenomenon.

* * * * *